United States Patent
Kang

(10) Patent No.: US 10,692,943 B2
(45) Date of Patent: Jun. 23, 2020

(54) TOUCH ORGANIC LIGHT-EMITTING DISPLAY DEVICE AND IN-CELL TOUCH ORGANIC LIGHT-EMITTING DISPLAY DEVICE

(71) Applicant: LG Display Co., Ltd., Seoul (KR)

(72) Inventor: Sin-Chul Kang, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 144 days.

(21) Appl. No.: 15/856,351

(22) Filed: Dec. 28, 2017

(65) Prior Publication Data

US 2018/0190724 A1 Jul. 5, 2018

(30) Foreign Application Priority Data

Dec. 30, 2016 (KR) .................. 10-2016-0184478

(51) Int. Cl.
| | | |
|---|---|---|
| *H01L 27/32* | (2006.01) | |
| *G06F 3/041* | (2006.01) | |
| *G06F 3/044* | (2006.01) | |
| *H01L 51/52* | (2006.01) | |

(52) U.S. Cl.
CPC ............ *H01L 27/323* (2013.01); *G06F 3/044* (2013.01); *G06F 3/0412* (2013.01); *G06F 3/0416* (2013.01); *H01L 51/5246* (2013.01); *G06F 2203/04111* (2013.01); *H01L 27/3244* (2013.01); *H01L 27/3276* (2013.01); *H01L 51/5253* (2013.01)

(58) Field of Classification Search
CPC combination set(s) only.
See application file for complete search history.

(56) References Cited

U.S. PATENT DOCUMENTS

| | | | | |
|---|---|---|---|---|
| 2010/0193469 A1* | 8/2010 | Lee | ....................... | B81C 1/0046 216/49 |
| 2013/0168679 A1* | 7/2013 | Park | .................... | H01L 27/3276 257/59 |
| 2014/0061597 A1* | 3/2014 | Choi | .................... | H01L 51/5284 257/40 |
| 2018/0005772 A1* | 1/2018 | Jeong | .................... | G06F 3/0412 |

\* cited by examiner

*Primary Examiner* — Temesghen Ghebretinsae
*Assistant Examiner* — Sosina Abebe
(74) *Attorney, Agent, or Firm* — Morgan, Lewis & Bockius LLP

(57) ABSTRACT

A touch organic light-emitting display device includes: a substrate including: a display area, and a non-display area, a lower base crossing the display area and the non-display area, an upper base opposite the lower base, the upper base crossing the display area and the non-display area, an adhesive layer between the lower base and the upper base, and a pad portion in the non-display area, wherein the upper base includes a plurality of concave patterns and at least one upper dam at a position corresponding to a region between the pad portion and the display area.

14 Claims, 9 Drawing Sheets

(a)

(b)

(c)

(d)

(e)

TOUCH ORGANIC LIGHT-EMITTING DISPLAY DEVICE AND IN-CELL TOUCH ORGANIC LIGHT-EMITTING DISPLAY DEVICE

CROSS-REFERENCE TO RELATED APPLICATIONS

This application claims the priority of Korean Application No. 10-2016-0184478, filed on Dec. 30, 2016, the entirety of which is hereby incorporated by reference.

BACKGROUND

1. Technical Field

The present disclosure relates to a touch organic light-emitting display device and an in-cell touch organic light-emitting display device.

2. Discussion of the Related Art

An image display device, which displays various pieces of information on a screen, is a core technology of the information and communication age, and is being developed in the direction of becoming thinner, lighter, more portable, and having higher performance. As a flat-panel display device that is capable of overcoming the problems of disadvantageous weight and volume of a cathode ray tube (CRT), for example, an organic light-emitting display device, which displays an image by controlling the intensity of luminescence of an organic emission layer, is attracting attention.

The organic light-emitting display device displays an image using a plurality of pixels, which are arranged in a matrix form. Here, each pixel includes a light-emitting element and a pixel-driving circuit having multiple transistors that implement independent driving of the light-emitting element.

The organic light-emitting display device described above uses a self-illuminating organic light-emitting element, and therefore, does not require a separate light source and enables a super-thin-type display to be provided. Therefore, in recent years, research on a display device having an in-cell touch structure, which uses an organic light-emitting element and includes a touch electrode array inside a light-emitting cell, and more particularly, research on a flexible display device using a flexible substrate, have been actively conducted.

A touch display device is constructed such that a lower substrate having an organic light-emitting element and an upper substrate having a touch electrode array are bonded to each other by an adhesive layer to be opposite each other. Here, a plurality of pad electrodes for applying signals to the touch electrode array may be provided in a non-display area of the lower substrate, and may be bonded to upper pad electrodes, which are connected to touch electrodes of the touch electrode array of the upper substrate, by a conductive ball.

The touch display device is manufactured in a manner such that the lower substrate and the upper substrate are bonded to each other by applying an adhesive agent thereto, after which the adhesive agent is hardened. However, when the adhesive agent is applied, a problem occurs in that the adhesive agent overflows to the pad electrodes of the lower substrate. At this time, because the adhesive agent is an insulating material, when the pad electrodes are covered with the adhesive agent, contact failure of the pad electrodes may occur.

Meanwhile, in the related art, a flexible display device may be formed in a manner such that a flexible substrate is attached to each of the upper substrate and the lower substrate, the upper substrate and the lower substrate are bonded to each other, and the upper substrate and the lower substrate, excluding the flexible substrate, are removed by laser irradiation. At this time, when the flexible substrate is not completely covered with the adhesive agent applied thereto, the flexible substrate may be damaged in the laser irradiation, causing scattering of foreign substances and consequent operational defects, or pores may be formed in a region in which wires are provided, causing deterioration in reliability of the wires. Further, if the adhesive agent is applied in excess, it may be directly bonded to the upper substrate and the lower substrate, making it impossible to remove the upper substrate and the lower substrate using a laser.

SUMMARY

Accordingly, the present disclosure is directed to a touch organic light-emitting display device and an in-cell touch organic light-emitting display device that substantially obviate one or more of the issues due to limitations and disadvantages of the related art.

An aspect of the present disclosure is to provide a touch organic light-emitting display device that is capable of preventing an adhesive layer from overflowing to a pad portion by controlling the flow of the adhesive layer and of improving the reliability of the pad portion and wires by enabling the adhesive layer to be evenly distributed in a region that is in contact with the wires.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a touch organic light-emitting display device, including: a substrate including: a display area, and a non-display area, a lower base crossing the display area and the non-display area, an upper base opposite the lower base, the upper base crossing the display area and the non-display area, an adhesive layer between the lower base and the upper base, and a pad portion in the non-display area, wherein the upper base includes a plurality of concave patterns and at least one upper dam at a position corresponding to a region between the pad portion and the display area.

In another aspect, there is provided an in-cell touch organic light-emitting display device, including: a substrate including: a display area, and a non-display area, an organic light-emitting element in the display area, a touch electrode array over the organic light-emmitting element, a lower base crossing the display area and the non-display area, an upper base opposite the lower base, the upper base crossing the display area and the non-display area, an adhesive layer between the lower base and the upper base, and a pad portion in the non-display area, wherein the upper base includes a plurality of concave patterns and at least one upper dam at a position corresponding to a region between the pad portion and the display area.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
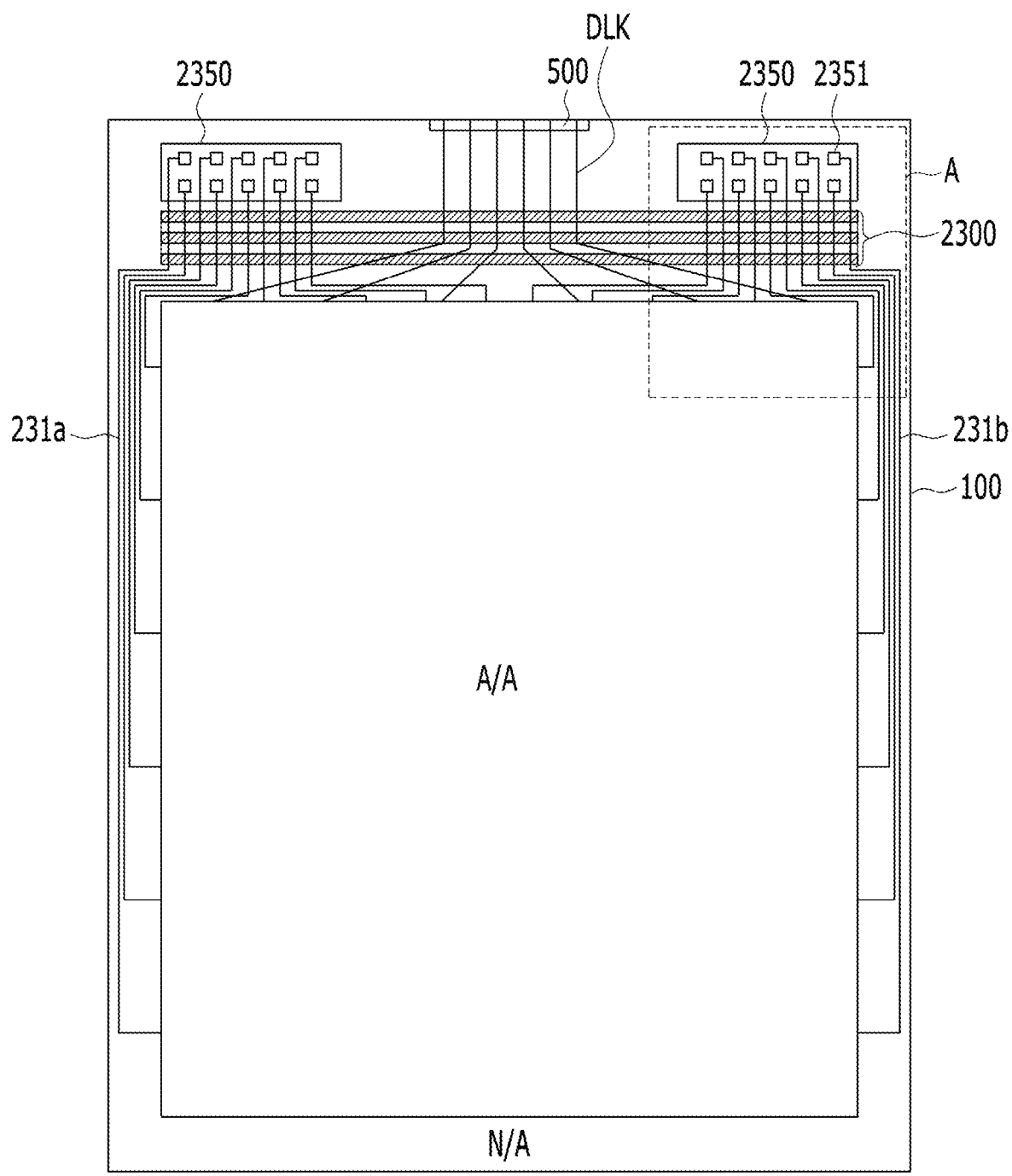
FIG. 1 is a front view illustrating a touch organic light-emitting display device according to a first embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

FIG. 1 is a front view illustrating a touch organic light-emitting display device according to a first embodiment of the present disclosure.

A touch organic light-emitting display device according to the first embodiment of the present disclosure includes a display panel 100, in which a display area A/A and a non-display area N/A are defined.

In the display area A/A, a plurality of light-emitting elements and a pixel circuit for driving the light-emitting elements may be provided. To this end, a connecting portion 500 may be provided at a marginal portion of the non-display area N/A. The connecting portion 500 may be connected to a chip-on-film (COF) film (not illustrated) or a flexible printed circuit board (not illustrated), on which a driving circuit (not illustrated) may be mounted, and may receive various signals for driving the display panel 100 from the driving circuit, and may transmit the same.

With reference to FIG. 1, the connecting portion 500 may be provided with a plurality of data links DLK. The data links DLK may transmit the pixel-driving signals supplied from the connecting portion 500 to respective pixel-driving circuits located in the display area A/A.

A pad portion for supplying various signals to the display area A/A may be provided In the non-display area N/A of the display panel 100. In an example, a touch pad portion 2350 for supplying a touch signal to the display area A/A and performing touch sensing may be provided in the non-display area of the display panel 100. The touch pad portion 2350 may include a plurality of touch pad electrodes 2351.

The touch pad portion 2350 may be sectioned into two units, which may be positioned to the left and right of the connecting portion 500. However, embodiments are not limited thereto. The position of the touch pad portion 2350 may vary depending on the design.

Routing lines 231a and 231b may be connected to the touch pad electrodes 2351. The routing lines 231a and 231b may transmit a touch signal from the touch pad portion 2350 to the display area A/A.

At least one dam 2300 may be provided at a portion of the non-display area N/A that may be located between the display area A/A and the touch pad portion 2350. Although not illustrated in the front view of FIG. 1, the display panel 100 may have a structure in which an upper plate and a lower plate are bonded to each other using an adhesive layer. The dam 2300 may be provided inside the display panel 100, and may prevent contact failure of the pad electrodes by preventing an adhesive agent from overflowing to the electrodes provided at the touch pad portion 2350 in the process of bonding the upper plate and the lower plate of the display panel 100 to each other.

Further, the dam 2300 may control the flow of the adhesive agent, and may fill the display panel 100 with the adhesive agent to cover the lines, which may be liable to electric disconnection, for example, the routing lines 231a and 231b. Accordingly, the dam 2300 may ensure reliability of the wires, including the routing lines 231a and 231b, and may prevent the scribing quality from being degraded upon overfilling of adhesive agent when a scribing process is performed after the display panel 100 is assembled.

The dam 2300 may be provided at the upper plate, or may be provided at both the upper plate and the lower plate of the display panel 100. In the present disclosure, the dam provided at the upper plate will be referred to as an "upper dam," and the dam provided at the lower plate will be referred to as a "lower dam."

The description of the positions of the touch pad portion 2350, the routing lines 231a and 231b, the connecting portion 500, the data links DLK and the dam 2300 within the display panel 100 and the relationships thereamong will be made in detail later. First, however, an example structure of the display panel 100 will be described briefly with reference to FIG. 2.

Figure 2:
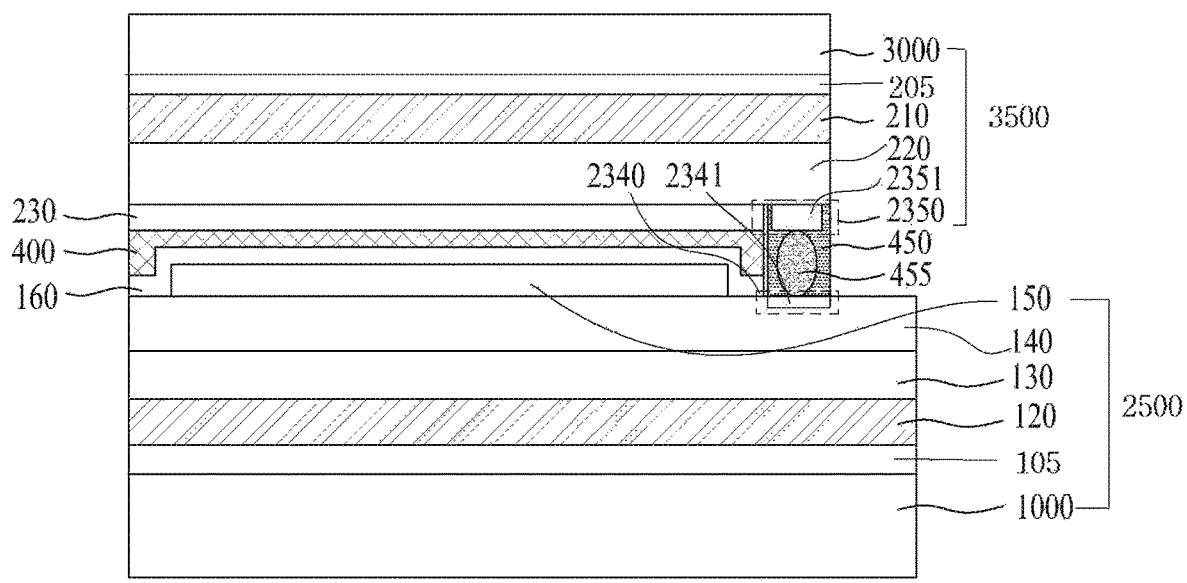
FIG. 2 is a schematic view illustrating the cross-sectional structure of a display panel.

FIG. 2 is a schematic view illustrating the cross-sectional structure of the display panel.

The display panel 100 may have a structure in which a lower plate 2500 and an upper plate 3500 may be bonded to each other using an adhesive layer 400. The lower plate 2500 may include a lower substrate 1000, a first sacrificial layer 105 disposed on the lower substrate 1000, a lower base 120 disposed on the first sacrificial layer 105, a first buffer layer 130 disposed on the lower base 120, a thin-film transistor array 140 in which pixels may be defined in a matrix form on the first buffer layer 130 and thin-film transistors may be provided for the respective pixels, an organic light-emitting array 150 connected to the thin-film transistor of each pixel, and a protective layer 160 that may cover the organic light-emitting array 150.

The upper plate 3500, which may be disposed opposite the lower plate 2500, may include an upper substrate 3000, a second sacrificial layer 205 disposed on the upper substrate 3000, an upper base 210 disposed on the second sacrificial layer 205 to be opposite the lower base 120, a second buffer layer 220 disposed on the upper base 210, and a touch electrode array 230 disposed on the second buffer layer 220.

The lower plate 2500 and the upper plate 3500 may be bonded to each other via the adhesive layer 400 to be opposite each other. Accordingly, the organic light-emitting array 150 and the protective layer 160 may be bonded to the touch electrode array 230 via the adhesive layer 400 to be opposite each other. That is, the lower base 120 and the upper base 210 may be disposed opposite each other, with the adhesive layer 400 interposed therebetween.

Here, after the bonding of the lower plate 2500 and the upper plate 3500, to realize a flexible display device, the first sacrificial layer 105, the lower substrate 1000, the second sacrificial layer 205 and the upper substrate 3000 may be removed.

The lower and upper bases 120 and 210 may prevent damage to the internal arrays in the process of removing the lower substrate 1000 and the upper substrate 3000 and processes subsequent thereto. The lower and upper bases 120 and 210 may be formed of a flexible material so that the display panel 100 may be embodied as a flexible display panel. Depending on the design, the lower and upper bases 120 and 210 may be formed of a glass material, and may serve as substrates.

In each of the first buffer layer 130 and the second buffer layer 220, a display area A/A and a non-display area N/A are defined. The first and second buffer layers 130 and 220 may prevent oxygen and moisture from permeating the organic films provided at the organic light-emitting array 150. That is, the first and second buffer layers 130 and 220 may serve as barriers against outside air and moisture.

The thin-film transistor array 140 may include a gate line and a data line, which may intersect each other, and a thin-film transistor formed at an intersecting portion of the gate line and the data line. A dummy pad area 2340 may be provided at an area of the thin-film transistor array 140 that may correspond to the touch pad portion 2350.

The organic light-emitting array 150 may include a first electrode formed at the pixel, a second electrode formed at the upper layer, which may be spaced apart from the first electrode, and an organic emission layer, which may be formed between the first electrode and the second electrode. Here, the first electrode may be connected to a drain electrode of the thin-film transistor.

The touch electrode array 230 may be bonded to be opposite the organic light-emitting array 150. The touch electrode array 230 may include a plurality of touch electrodes, which may be arranged in the display area A/A, to sense a touch applied by the user.

The touch electrode array 230 and the touch pad portion 2350 may be formed on the same surface of the second buffer layer 220. The touch pad electrode 2351 of the touch pad portion 2350 may be connected to a dummy pad electrode 2341 of the thin-film transistor array 140 by a seal 450 including conductive balls 455, for example, an anisotropic conductive film (ACF), in a vertical bonding process using the adhesive layer 400. At this time, the adhesive layer 400 may have a moisture permeation reduction or prevention function, and may be directly in contact with the protective layer 160, which may cover the organic light-emitting array 150. Therefore, the adhesive layer 400 may reduce or prevent outside air from entering the organic light-emitting array 150, and may more reliably reduce or prevent the permeation of moisture, in addition to the function of the protective layer 160.

Here, the thin-film transistor array 140 may be configured to protrude further than one side of the touch electrode array 230. The connecting portion 500, described above with reference to FIG. 1, may be provided at the protruding portion. The connecting portion 500 may be connected to the flexible printed circuit board, to which a driving circuit may be mounted, and may receive driving signals from the driving circuit and may supply the driving signals to the thin-film transistor array 140 and the touch electrode array 230 via the data links DLK shown in FIG. 1.

Figure 3:
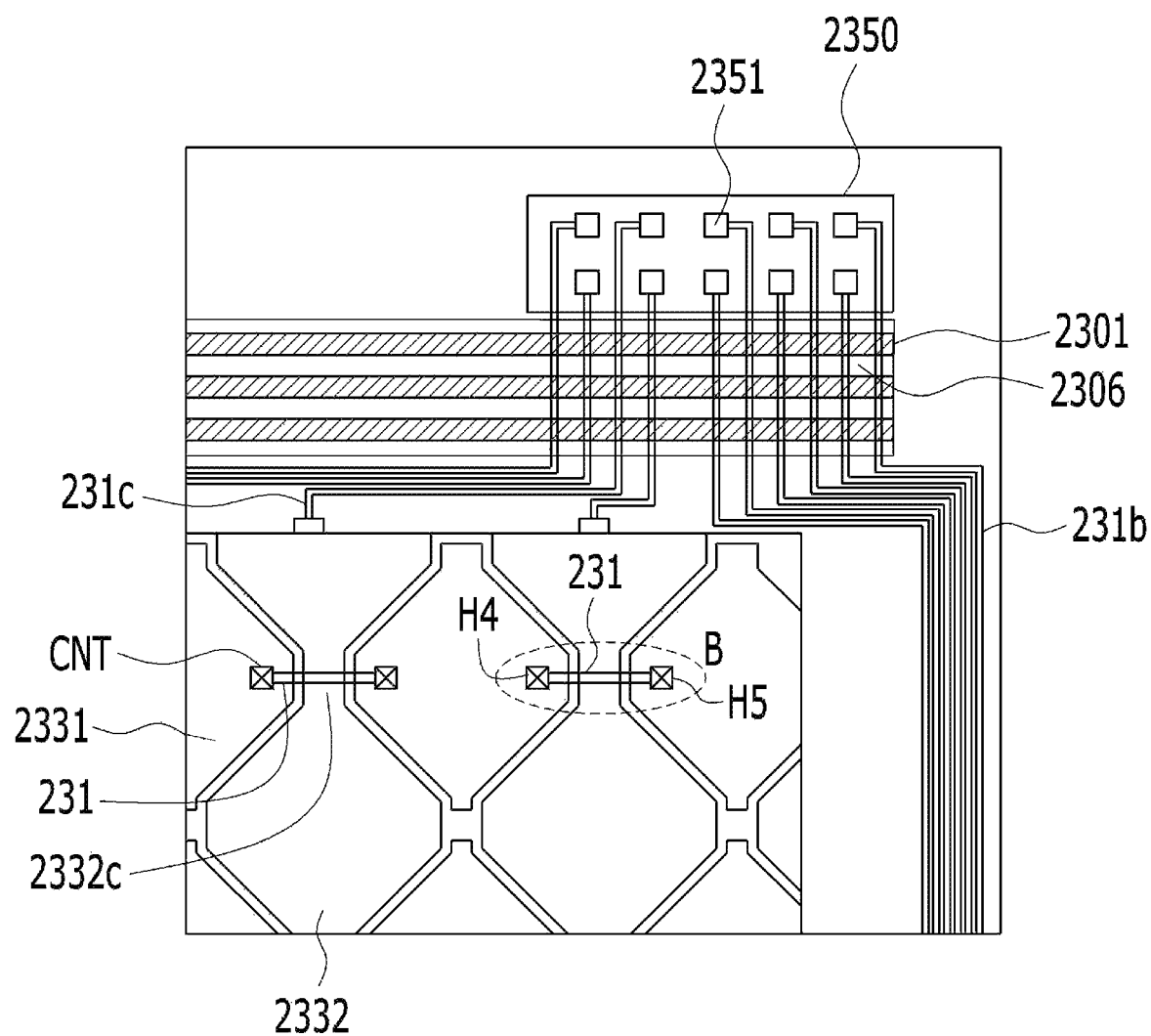
FIG. 3 is an enlarged plan view of an upper plate in the portion "A" of FIG. 1 to explain the position of an upper dam provided at the upper plate.

FIG. 3 is an enlarged plan view of an upper plate in the portion "A" of FIG. 1 to explain the position of an upper dam provided at the upper plate.

The example of FIG. 3 is an enlarged plan view of the upper plate 3500 in the region indicated by "A" in FIG. 1 to explain the position of the upper dam 2301 provided at the upper plate 3500. As shown in the FIG. 3 example, the touch electrode array 230 according to the present disclosure may include first electrode patterns 2331 and second electrode patterns 2332, which may be arranged to intersect each other, and touch pad electrodes 2351, which may transmit signals to the first and second electrode patterns 2331 and 2332. The touch pad electrodes 2351 may be formed at the touch pad portion 2350, and may be connected to the dummy pad electrode 2341 (see FIG. 3) of the thin-film transistor array.

The first electrode patterns 2331, each of which may be formed in an island shape, may be physically spaced apart from each other in a first direction. There may be further provided metal bridges 231 for electrically connecting neighboring first electrode patterns 2331 to each other.

The second electrode patterns 2332 may be arranged in a second direction, which may intersect the first direction, and may be formed in the same shape as the first electrode patterns 2331. There may be further provided connecting patterns 2332c, which may be formed integrally with the second electrode patterns 2332 to connect neighboring second electrode patterns 2332 to each other.

The first electrode patterns 2331 and the bridges 231 may be connected to each other in the first direction and may constitute a first touch electrode. The second electrode patterns 2332, and the connecting patterns 2332c may be connected to each other in the second direction and may constitute a second touch electrode. One of the first touch electrode and the second touch electrode may serve as a touch driving electrode, which may supply a touch sensing signal, and the other one may serve as a touch sensing electrode, which may sense a touch signal. The first electrode patterns 2331 and the second electrode patterns 2332 may be formed in the same layer while being spaced apart from each other, and may be electrically insulated from each other.

The above-described routing lines 231b and 231c, which may be arranged in the y-axis direction and may connect the touch electrodes provided at the touch electrode array 230 to the touch pad portion 2350, may be provided outside the display area A/A. The upper dam 2301 may be disposed between the display area A/A and the touch pad portion 2350. Here, the upper dam 2301 may be formed by patterning the upper base 210 (see FIG. 2). Accordingly, the upper base 210 may include a concave pattern 2306, which may be formed by concavely patterning an area of the upper base 210 around the upper dam 2301. The concave pattern 2306 may be formed in a stripe shape, and the upper dam 2301 may be split into pieces by the concave pattern 2306. The upper dam 2301 may also be formed in a stripe shape, like the concave pattern 2306.

At this time, if the upper dam 2301 and the concave pattern 2306 are formed to be shorter than the touch pad portion 2350, the adhesive layer 400 may be introduced into an area of the touch pad portion 2350 that extends further than the upper dam 2301 and the concave pattern 2306. Therefore, the upper dam 2301 and the concave pattern 2306 may be formed in a stripe shape, which is longer than the touch pad portion 2350. As a result, the upper dam 2301 and the concave pattern 2306 may reduce or prevent the aforementioned adhesive layer 400 (see FIG. 2) from overflowing to the touch pad portion 2350.

The concave pattern 2306 may be formed in the shape of a hole or slit that completely penetrates the upper base 210. That is, the concave pattern 2306 may be embodied as a hole or slit that may be formed by patterning the upper base 210. As such, when the concave pattern 2306 completely penetrates the upper base 210, the routing lines 231b, which may intersect the concave pattern 2306, may not be supported by the upper base 210. As described above, because the lower substrate 1000, the first sacrificial layer 105, the second sacrificial layer 205 and the upper substrate 3000 may be removed after the bonding of the lower plate 2500 (see FIG. 2) and the upper plate 3500 (see FIG. 2), the routing lines 231b, which may overlap the concave pattern 2306, which may completely penetrate the upper base 2106, may be formed on very thin insulation films of the touch electrode array 230 and the buffer layer 220. Therefore, when the concave pattern 2306 and the routing lines 231b overlap each other in a very large area, the routing lines 231b may not be sufficiently supported, and may be liable to be defective, for example, may be electrically disconnected. Therefore, the routing lines 231b may overlap the upper dam 2301 in a small or minimum area. To reduce or minimize the area in which the routing lines 231b intersect the concave pattern 2306 of the upper dam 2301, the routing lines 231b may be formed to intersect the upper dam 2301 in a direction perpendicular thereto.

Figure 4:
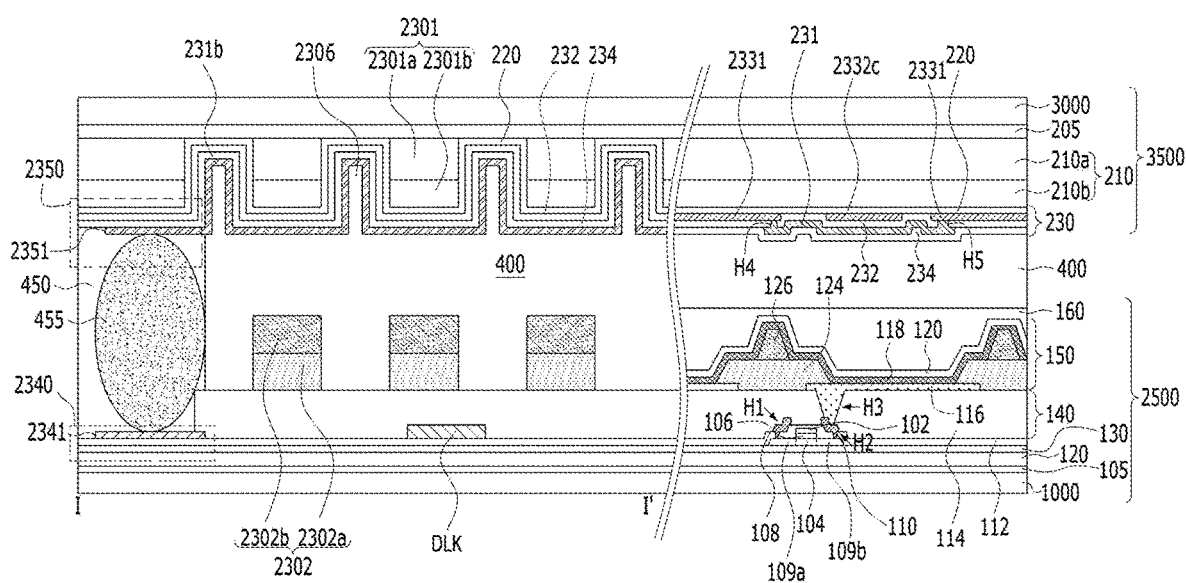
FIG. 4 is a sectional view illustrating the cross-section of portion "B" in FIG. 3 and the cross-section cut along line II-IF in FIG. 3.

FIG. 4 is a sectional view illustrating the cross-section of portion "B" in FIG. 3 and the cross-section cut along line II-II' in FIG. 3.

As described above, the lower plate 2500 may be formed by sequentially stacking the lower substrate 1000, the sacrificial layer 105, the lower base 120, the thin-film transistor array 140, and the organic light-emitting array 150. The thin-film transistor array 140, which may include a plurality of thin-film transistors, may be formed on the buffer layer 130 of the display area A/A. Each of the thin-film transistors may include a semiconductor layer 104 that may include a source region 109a and a drain region 109b formed at left and right sides thereof, a gate insulation film 106 that may cover the semiconductor layer 104, a gate electrode 102 that is disposed on the region of the gate insulation film 106 that corresponds to the semiconductor layer 104, a first interlayer insulation film 112 that may be disposed on the buffer layer 130 including the gate electrode 102 and may have contact holes H1 and H2 formed to expose the source and drain regions 109a and 109b, and a source electrode 108 and a drain electrode 110, which may be connected to the source and drain regions 109a and 109b through the contact holes. A first passivation layer 114 may be disposed on the source electrode 108 and the drain electrode 110 of the thin-film transistor.

The organic light-emitting array 150 may include a contact hole H3, which may be formed by etching a portion of the first passivation layer 114 to expose a portion of the drain electrode 110, a first electrode 116 that may be in contact with the drain electrode 110 through the contact hole H3, a bank layer 124 that may define a pixel area and may have an opening formed to expose the first electrode 116, a spacer 126 disposed on the bank layer 124, an organic emission layer 118 formed on the first electrode 116, and a second electrode 120 formed on the organic layer 118. A protective layer 160 is disposed on the organic light-emitting array 150. The protective layer 160 may be formed by alternately stacking at least one inorganic film and at least one organic film one above another, and may serve to protect the organic light-emitting array 150 from outside moisture.

The upper plate 3500 may include an upper substrate 3000, a second sacrificial layer 205, an upper base 210, and a touch electrode array 230. The upper substrate 3000 and the second sacrificial layer 205, as described above, may be removed after the bonding of the upper plate 3500 and the lower plate 2500, to realize a more flexible and thinner display panel.

The upper base 210 may include two layers, e.g., a first upper base 210a and a second upper base 210b. The second upper base 210b may be stacked on the surface of the first upper base 210a that may be opposite the lower base 120. When the upper base 210 is formed to be thick using two layers, the height of the upper dam 2301, which may be formed by patterning the upper base 210, may also be increased. When the upper base 210 is formed in a two-layer structure, the upper dam 2301 may have a height ranging from about 4 μm to about 5 μm.

A buffer layer 220 may be formed on the inner surface of the upper base 210. The touch electrode array 230 may have a structure in which first and second electrode patterns 2331 and 2332 and connecting patterns 2332c may be formed on the buffer layer 220, a second interlayer insulation film 232, which may have contact holes H4 and H5 formed to expose a portion of the first electrode patterns 2331, may be subsequently formed thereon, bridges 231 that may connect neighboring first electrode patterns 2331 through the contact holes H4 and H5, may be subsequently formed thereon, and a second passivation layer 234 may be subsequently formed thereon. The touch electrode array 230 having the above structure may be bonded to the protective layer 160 via the adhesive layer 400 to be opposite the protective layer 160. Accordingly, in the actual in-cell touch organic light-emitting display device, the touch electrode array 230, as shown in the FIG. 4 example, may be in the state of being vertically inverted from the above-described structure. The lower substrate 1000, the first sacrificial layer 105, the upper substrate 3000 and the second sacrificial layer 205, as described above, may be removed to realize a flexible display device.

A dummy pad electrode 2341 may be formed on a region of the first buffer layer 130 that may correspond to the touch pad portion 2350. The dummy pad electrode 2341 may be formed on the first interlayer insulation film 112, and may be exposed by removing a portion of the first passivation layer 114 that may be disposed on the dummy pad electrode 2341. The dummy pad electrode 2341 may be formed simultaneously with or in a same operation as the gate electrode 102 of the display area A/A using the same material, or may be formed simultaneously with or in a same operation as the source and drain electrodes 108 and 110 using the same material. However, embodiments are not limited thereto.

A touch pad electrode 2351 may be formed at the touch pad portion 2350. The touch pad electrode 2351 may be formed on the second interlayer insulation film 232, and may be exposed by removing a portion of the second passivation layer 234 disposed on the touch pad electrode 2351. Because the touch electrode array 230 may be bonded to the organic light-emitting array 150 to be opposite the same, the touch pad electrode 2351 may be located below the first upper passivation layer 232 in the bonded structure. Accordingly, the second upper passivation layer 234 may be located below the upper electrode 2311, and the upper electrode 2311 may be exposed by removing a portion of the second upper passivation layer 234.

The lower electrode 1081 and the upper electrode 2351 may be electrically connected to each other by a seal 450, e.g., including conductive balls 455, for example, an anisotropic conductive film (ACF). The touch pad electrode 2351 may supply a touch signal from the dummy pad electrode 2341 to the first and second electrode patterns 2331 and 2332 through the routing lines 231b. At this time, the routing lines 231b and the first and second electrode patterns 2331 and 2332 may be formed in different layers from each other, and may be electrically connected to each other via the contact holes.

The upper dam 2301 and the concave pattern 2306 may be provided in the region between the display area A/A and the touch pad portion 2350. The concave pattern 2306 may be formed by patterning the second base 210. The concave pattern 2306 may be provided in a plural number, and the upper dam 2301 may be defined as the region between the concave patterns 2306. Here, the concave pattern 2306 may be embodied as a slit that completely penetrates the second base 210. Accordingly, the buffer layer 230, which may be in contact with the concave pattern 2306, has an uneven portion. Further, the routing lines 231c, which may intersect the concave pattern 2306, may also have an uneven portion on the concave pattern 2306. Further, the second interlayer insulation film 232 and the second passivation layer 234 may also have uneven portions at regions thereof that correspond to the concave pattern 2306.

The concave pattern 2306, as described above, may be embodied as a slit, which may completely penetrate the second base 210. Here, although the concave pattern 2306 may be formed to penetrate the second base 210, the buffer layer 230 may be formed on the region of the concave pattern 2306 in contact with the second sacrificial layer 205. The buffer layer 220 of the concave pattern 2306 may remain, even after the second sacrificial layer 205 is removed, and may reduce or prevent the routing lines 231b from being completely exposed to the outside of the concave pattern 2306, and may support the routing lines 231b to a certain extent.

The adhesive layer 400 may also be positioned at regions of the routing lines 231b that correspond to the concave pattern 2306, and thus may firmly support the routing lines 231b, in addition to the buffer layer 220. As such, the routing lines 231b, which may intersect the concave pattern 2306, may be primarily supported by the buffer layer 220 and may be secondarily supported by the adhesive layer 400. Therefore, although the concave pattern 2306 may be embodied as a slit, if the width of the concave pattern 2306 is formed to be narrower than a predetermined width, the routing lines 231b may be formed to intersect the concave pattern 2306. However, if the width of the concave pattern 2306 exceeds the predetermined width, there may be a limit in the ability to support the routing lines 231b, which may be positioned in the region in which the second base 210 is not present, using only the thin buffer layer 220 and the adhesive layer 400. Therefore, to minimize the area in which the routing lines 231b overlap the concave pattern 2306 and the dam 2301, the routing lines 231b may be formed to intersect the concave pattern 2306 and the dam 2301 in a direction perpendicular thereto. In an experiment, when the width of the concave pattern 2306 was less than 200 μm, although the concave pattern 2306 was embodied as a slit, it was confirmed that the routing lines 231b had no defects.

The concave pattern 2306 and the upper dam 2301 may control the flow of the adhesive agent that forms the adhesive layer 400. Therefore, even if a slight excess of adhesive agent is applied, it may be possible to prevent the adhesive agent from overflowing (or reduce overflow) to the touch pad electrode 2351 of the touch pad portion 2350 and the dummy pad electrode 2341. Further, even if a slight excess of adhesive agent is applied, the concave pattern 206 may absorb some of the adhesive agent, and the upper dam 2301 may control the flow of the adhesive agent, thereby preventing the adhesive agent from overflowing (or reducing overflow) to the touch pad portion 2350. That is, according to the present disclosure, it may be permissible to apply a slightly large amount of adhesive agent in the process of bonding the lower plate 2500 and the upper plate 3500 to each other. As a result, the in-cell touch organic light-emitting display device according to the present disclosure may have an effect of greatly reducing the possibility of overflow of the adhesive agent to the touch pad portion 2350, reducing or preventing the adhesive agent from being applied insufficiently due to concern about overflow, reliably supporting the routing lines 231b by allowing the adhesive layer 400 to be sufficiently applied to the region in which the routing lines 231b are positioned, and reducing or preventing the routing lines 231b from becoming defective, for example, becoming electrically disconnected.

As described above, the upper base 210 may have a two-layer structure, including the first upper base 210a and the second upper base 210b. Accordingly, the upper dam 2301 may also include a first upper dam 2301a and a second upper dam 2301b. As such, when the upper base 210 includes the first upper base 210a and the second upper base 210b, the height of the upper dam 210 may be further increased, making it possible to more effectively control the flow of the adhesive layer 400.

A lower dam 2302 may be provided on the lower plate 2500 to overlap the upper dam 2301. The lower dam 2302 may prevent the adhesive agent for forming the adhesive layer 400 from overflowing to the pad portion P/A, together with the upper dam 2301.

At this time, because the lower dam 2302 may be formed to overlap the upper dam 2301, when observed from the front, like the upper dam 2301, the lower dam 2302 may be formed in a stripe shape, which is longer than the touch pad portion 2350.

The lower dam 2302 may be formed to have a two-layer structure. Described in more detail, the lower dam 2302 may be formed in a two-layer structure including a first lower dam 2302a and a second lower dam 2302b. At this time, the first lower dam 2302a may be formed simultaneously with or in the same operation as the bank layer 124 using the same material. Further, the second lower dam 2302b may be formed simultaneously with or in the same operation as the spacer 126 using the same material. As such, because the lower dam 2302 may be formed simultaneously with the bank layer 124 and the spacer 126 using the same material, it may be possible to ensure the height of the lower dam 2302 over a predetermined level (for example, 3 µm or more) without additional processing.

The data link DLK may be disposed between the dummy pad electrode 2341 and the display area A/A. The data link DLK may be formed in the same layer as the source and drain electrodes 108 and 110 of the thin-film transistor using the same material. That is, the data link DLK may be formed to pass through a region between the first interlayer insulation film 112 and the second passivation layer 114, below the lower dam 2302. Accordingly, the second passivation layer 114 may be formed on the data link DLK, and the lower dam 2302 may be formed above the data link DLK, and may extend over the data link DLK. That is, the data link DLK may first be formed on the flat surface, and the lower dam 2302 may then be formed above the data link DLK. Therefore, the data link DLK may be reduced or prevented from being deformed, for example, from becoming uneven due to the lower dam 2302.

Further, as described above, the lower dam 2302 and the upper dam 2301 may reduce or prevent the adhesive agent for forming the adhesive layer 400 from overflowing to the pad portion P/A, may reduce or prevent the adhesive agent from being applied insufficiently due to concern about overflow by greatly reducing the possibility of overflow of the adhesive agent to the touch pad portion 2350, and may allow the adhesive layer 400 to be sufficiently applied to the region above the data link DLK. In addition, the organic light-emitting display device according to the embodiment may have an effect of enhancing the reliability of the data link DLK.

Figure 5:
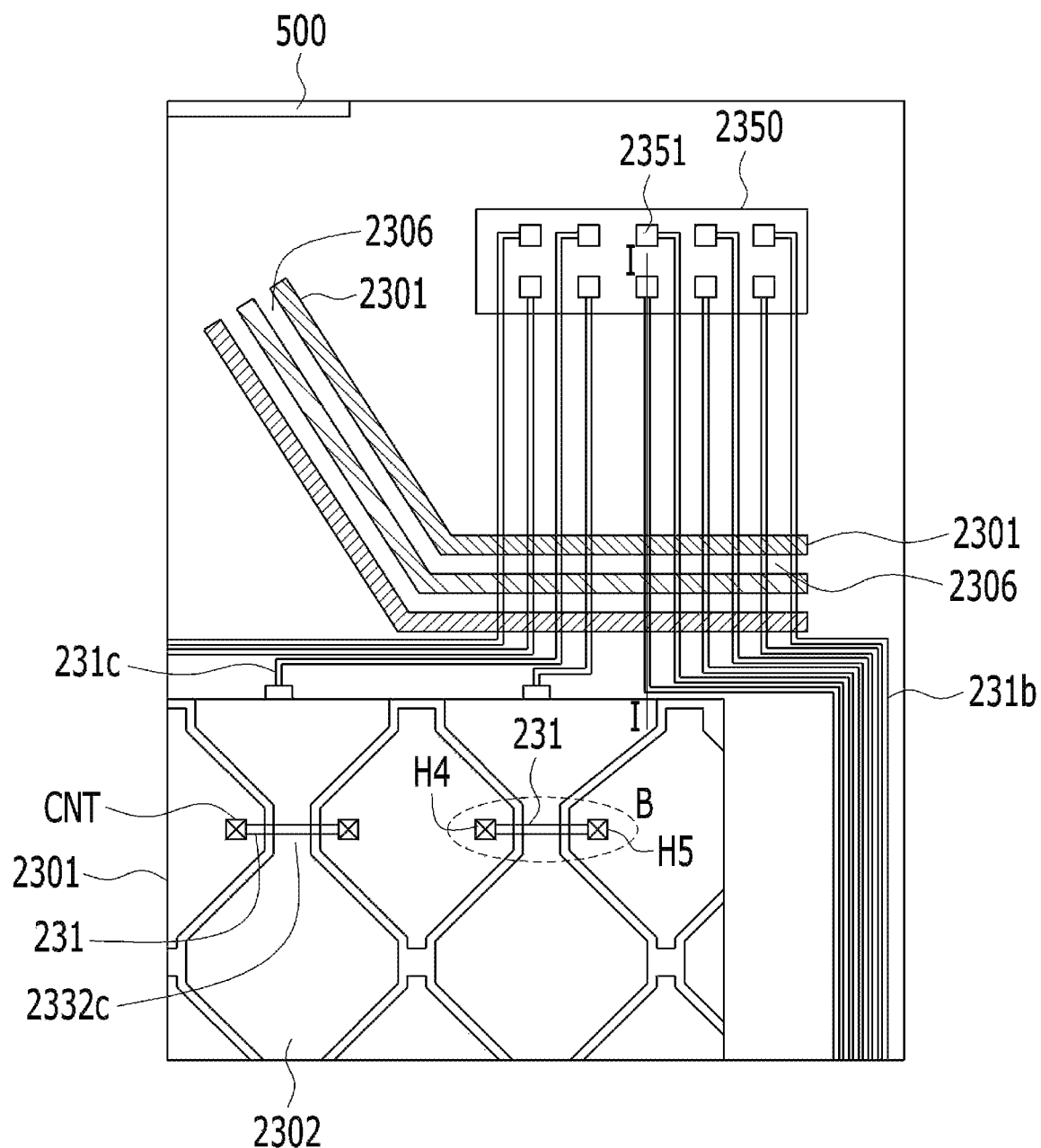
FIG. 5 is a view illustrating a region in which an upper dam and a concave pattern are positioned in a touch organic light-emitting display device according to a second embodiment.
Figure 6:
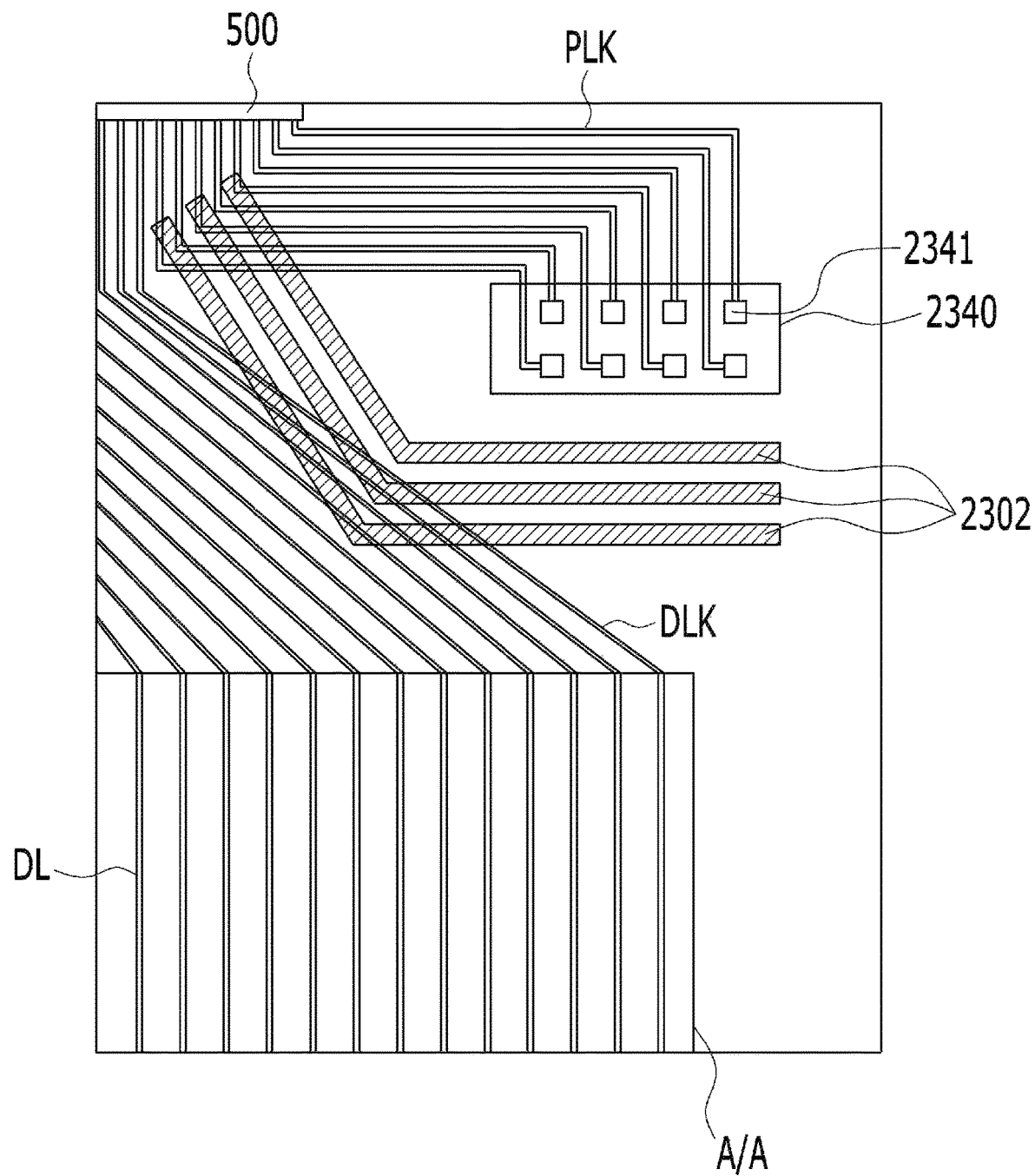
FIG. 6 is a schematic view for explaining the shape and the formation position of a lower dam provided below the structure shown in FIG. 5 and the relationship between the lower dam and data links.

FIG. 5 is a view illustrating a region in which an upper dam and a concave pattern are positioned in a touch organic light-emitting display device according to a second embodiment. FIG. 6 is a schematic view for explaining the shape and the formation position of a lower dam provided below the structure shown in FIG. 5 and the relationship between the lower dam and data links.

FIGS. 5 and 6 are examples that explain an upper dam 2301 and a lower dam 2302 of a touch organic light-emitting display device according to a second embodiment of the present disclosure. The touch organic light-emitting display device according to the second embodiment of the present disclosure has a similar construction as the first embodiment shown in FIG. 1, excluding the shapes of the upper dam 2301 and the lower dam 2302.

FIG. 5 is a view illustrating a region (which is the same region as indicted by "A" in the FIG. 1 example) in which the upper dam 2301 and the concave pattern 2306 are positioned in the organic light-emitting display device according to the second embodiment. Because the components other than the upper dam 2301 in FIG. 5 are substantially similar to those described above with reference to the FIG. 3 example, a detailed explanation thereof will be omitted.

The upper dam 2301 may be formed in a bent stripe shape in a manner such that it may extend parallel to the touch pad portion 2350, and may be bent and extend toward the connecting portion 500. In the organic light-emitting display device according to the second embodiment of the present disclosure, because the upper dam 2301 and the lower dam 2302 may be positioned to overlap each other and may be formed in a bent stripe shape, the upper dam 2301 and the lower dam 2302 may together control the flow of the adhesive agent that forms the adhesive layer 400. Therefore, according to the second embodiment of the present disclosure, owing to the upper dam 2301 and the lower dam 2302 being positioned to overlap each other and forming a bent stripe shape, it may be possible to control the flow of the adhesive layer 400 in the direction in which the upper dam 2301 and the lower dam 2302 are bent.

FIG. 6 is a schematic view for explaining the shape and the formation position of the lower dam 2302 provided below the structure shown in FIG. 5 and the relationship between the lower dam 2302 and the data links DLK. With reference to the FIG. 6 example, pad links PLK may be provided between the connecting portion 500 and the dummy pad electrodes 2341. The connecting portion 500 may supply various signals for touch sensing to the pad links PLK, and the signals may be supplied to the touch pad portion 2350 by the aforementioned conductive balls 455, and may then be supplied to the respective electrode patterns 2331 and 2332 via the routing lines 231b.

The data lines DL for supplying data signals may be provided in the display area A/A. A plurality of data links DLK may be formed between the display area A/A and the connecting portion 500. The data lines DL may receive the data signals from the connecting portion 500 via the data links DLK.

In the touch organic light-emitting display device according to the present disclosure, owing to the lower dam 2302, which may be formed in a stripe shape that may be bent toward the connecting portion 500, and the upper dam 2301 (see FIG. 5), which may overlap the lower dam 2302, it may be possible to induce the adhesive agent for forming the adhesive layer 400 (see FIG. 4) to flow in the direction in which the lower dam 2302 is bent, so that the adhesive agent may be collected on the data links DLK.

Therefore, a relatively large amount of adhesive agent may be applied to the data links DLK, and thus the region on the data links DLK may be filled with the adhesive layer 400 (see FIG. 4). Accordingly, the data links DLK may be firmly supported by the adhesive layer 400 (see FIG. 4), and may be prevented from becoming defective, for example, becoming electrically disconnected. Further, because the adhesive agent may be evenly distributed to the region near the connecting portion 500, there may be an effect of improving adhesion characteristics.

Figure 7:
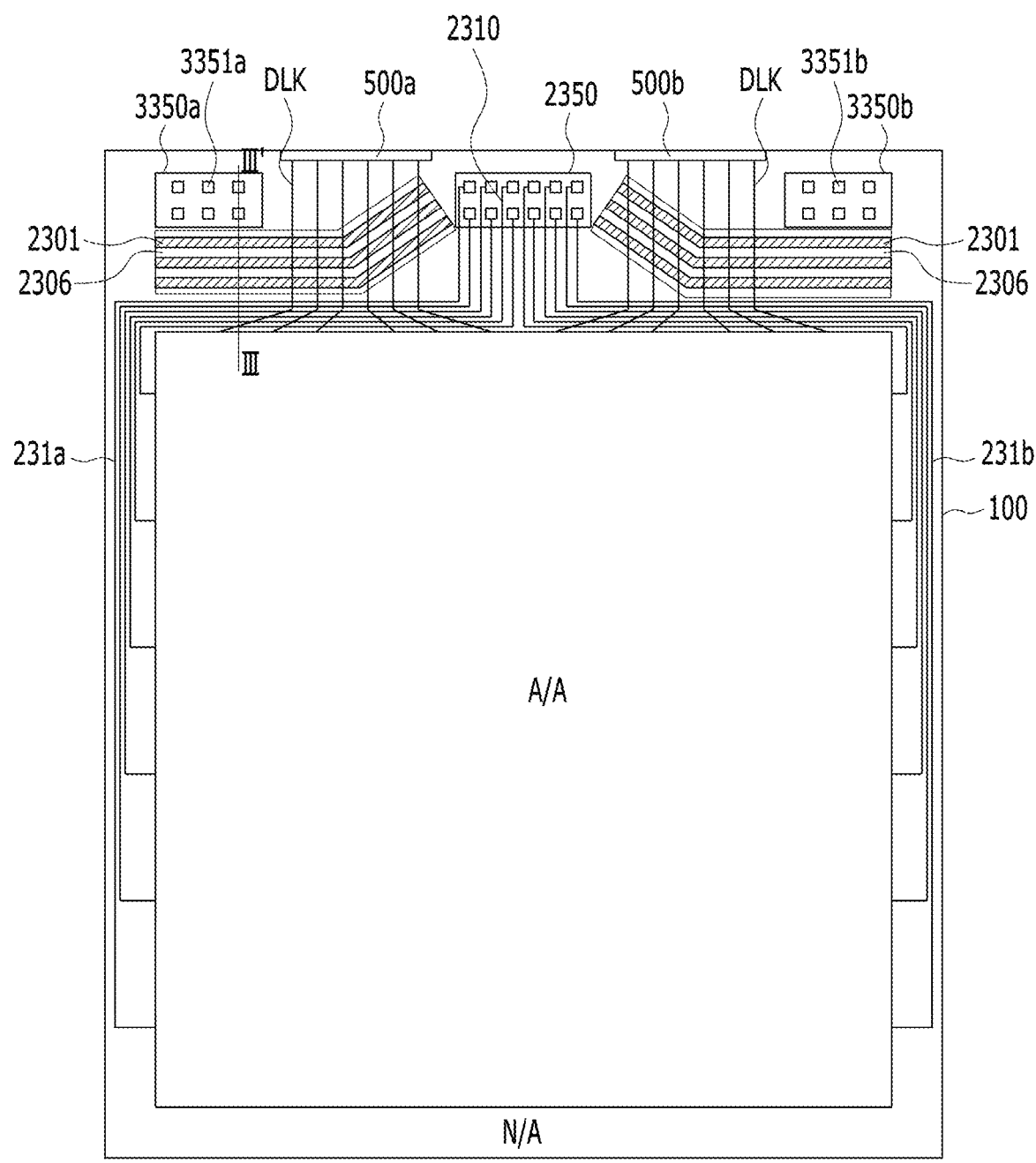
FIG. 7 is a front view for explaining a touch organic light-emitting display device according to a third embodiment of the present disclosure.

FIG. 7 is a front view for explaining a touch organic light-emitting display device according to a third embodiment of the present disclosure.

In the touch organic light-emitting display device according to the third embodiment of the present disclosure, a first connecting portion 500*a* and a second connecting portion 500*b* may be disposed in the non-display area N/A. Here, the first connecting portion 500*a* may be connected to a plurality of data links DLK to supply driving signals to half of the display area A/A. The second connecting portion 500*b* may be connected to a plurality of data links DLK to supply driving signals to the remaining half. In the case of a large-area display panel, the length of the data links DLK, which may be connected to data lines located at a peripheral region, may be excessively increased, which may cause an increase in resistance and load, signal supply delay, and consequent deterioration in image quality. However, the first and second connecting portions 500*a* and 500*b* may reduce or prevent the length of the data links DLK from being excessively increased in a large-area display device.

A plurality of pad portions may be provided in the non-display area N/A of the display panel 100. As one example of the pad portions, a touch pad portion 2350 may be provided between the first connecting portion 500*a* and the second connecting portion 500*b*. The touch pad portion 2350 may supply a touch signal to the display area A/A, and may sense a touch that may occur at the display area A/A.

As another example of the pad portions, there may be provided a lighting pad portion 3350, which may include a first lighting pad portion 3350*a*, that may be disposed outward from the first connecting portion 500*a* to perform inspection of lighting of the display area A/A, and a second lighting pad portion 3350*b* that may be disposed outward from the second connecting portion 500*b* for the same purpose. The lighting pad portion 3350 may include a plurality of lighting pad electrodes 3351*a* and 3351*b*.

The lighting pad portion 3350 may be provided at the lower plate 2500 of the display panel 100, and more particularly, may extend in the same layer as the thin-film transistor array 140 (see FIG. 2). The lighting pad portion 3350 may be connected to a plurality of data lines (not illustrated), provided in the display area A/A, to perform inspection of lighting of the display panel 100.

Routing lines 231*a* to 231*c* may be positioned between the touch pad portion 2350 and the display area A/A, may extend to the non-display area N/A, positioned to the left and right of the display area A/A, and may be connected to the aforementioned first and second touch electrodes (not illustrated).

That is, the touch pad portion 2350 according to the present disclosure may be positioned at the center of the non-display area N/A, which may be positioned upward from the display area A/A. The routing lines 231*a* to 231*c* may be connected to the touch pad portion 2350, and may extend to the regions positioned outward from the left and right sides of the display area A/A. The routing lines 231*a* and 231*b* may supply touch sensing signals to the touch electrodes (not illustrated) positioned in the display area A/A.

Upper dams 2301 and concave patterns 2306, which may have the same structure as those described above in the first and second embodiments, may be provided between the first lighting pad portion 3350*a* and the display area A/A and between the second lighting pad portion 3350*b* and the display area A/A. Further, although not illustrated in the FIG. 7 example, in the same way as the previous embodiments, lower dams may be provided below the regions corresponding to the upper dams 2301.

With reference to the example of FIG. 7, each of the upper dams 2301 may be formed to extend from a respective one of the first lighting pad portion 3350*a* and the second lighting pad portion 3350*b* toward the touch pad portion 2350. At this time, each of the upper dams 2301 may be formed to have a bent stripe shape in a manner such that it may extend in the horizontal direction and may be bent diagonally toward the touch pad portion 2350. That is, each of the upper dams 2301 may beformed in a stripe shape, including a portion arranged in the horizontal direction and a portion bent toward the touch pad portion.

Although shown as being shielded by the upper dams 2301 in the front view illustrated in FIG. 7, the lower dams 2301 (see FIG. 4) may be provided below the upper dams 2301 to overlap the upper dams 2301. Accordingly, the lower dams may have the same planar shape as the upper dams 2301, that is, each of the lower dams may include a portion arranged in the horizontal direction and a portion bent toward the touch pad portion.

The upper dams 2301 and the lower dams may reduce or prevent the adhesive agent for forming the adhesive layer 400 (see FIG. 4) from overflowing to the lighting pad electrodes 3351*a* and 3351*b* of the first and second lighting pad portions 3350*a* and 3350*b*. The upper dams 2301 and the lower dams may induce the adhesive agent to flow to the regions between the touch pad portion 2350 and the display area A/A, in which the routing lines 231*a* to 231*c* may be formed, thereby enabling the adhesive agent to firmly support the routing lines 231*a* to 231*c*.

Figure 8:
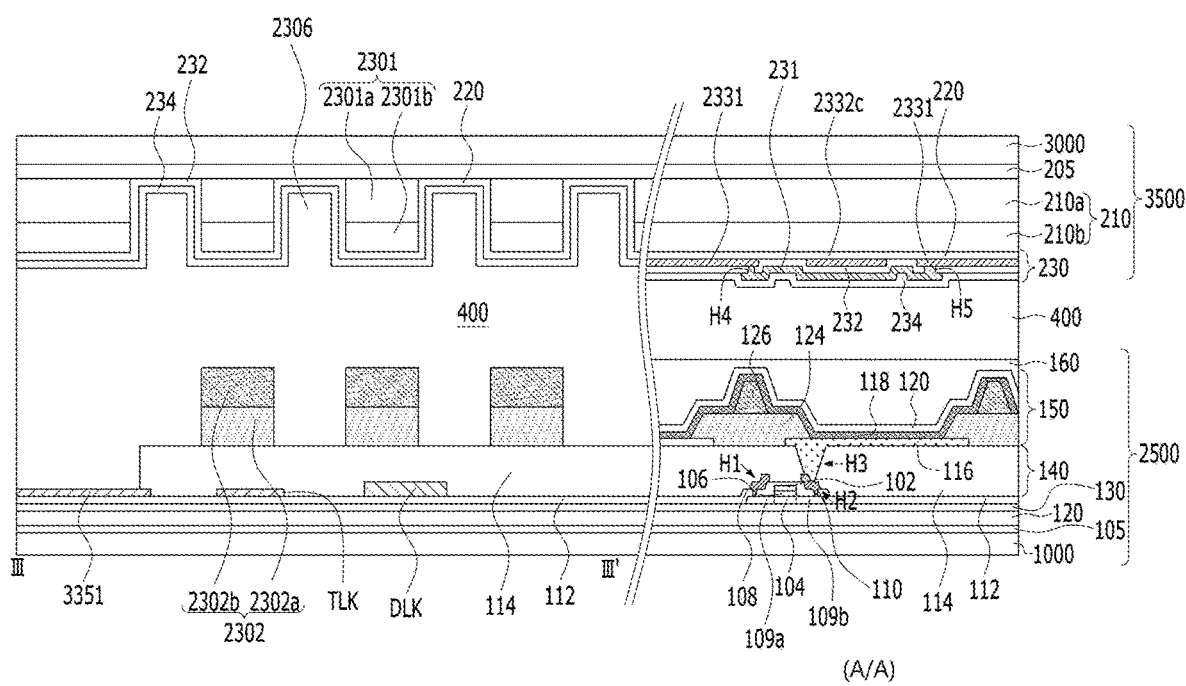
FIG. 8 is a sectional view taken along line in FIG. 7 to explain the shapes of lighting pad portions, an upper dam and a lower dam.

FIG. 8 is a sectional view taken along line in FIG. 7 to explain the shapes of lighting pad portions, an upper dam and a lower dam.

The FIG. 8 example explains the shapes of the lighting pad portions 3350*a* and 3350*b*, the upper dam 2301, and the lower dam 2302. Because the thin-film transistor array 140, the organic light-emitting array 150, and the touch electrode array 230 in the display area A/A may have the same structures as those described above with reference to FIG. 4, a detailed explanation thereof will be omitted in this embodiment.

The lighting pad electrode 2341 of the lighting pad portion 2340 may be formed in the same layer as the source and drain electrodes 108 and 110 or the gate electrode 102 of the thin-film transistor using the same material. Here, the data links DLK may also be formed in the same layer as the lighting pad electrode 2341 using the same material. The lighting pad portion 2340 and the display area A/A may be connected to each other by test lines TLK. The test lines TLK may also be formed in the same layer as the lighting pad electrode 2341 using the same material. Embodiments are not limited to these examples.

The lower dam 2301, the upper dam 2302, and the concave pattern 2306 may have the same cross-sectional structures as those of the previous embodiments. That is, the concave pattern 2306 may be formed by patterning the second base 210. The concave pattern 2306 may be provided in a plural number, and the upper dam 2301 may be defined as the region between the concave patterns 2306. The concave pattern 2306 may be embodied as a slit, which completely penetrates the second base 210. Accordingly, the buffer layer 230, which may be in contact with the concave pattern 2306, may also have an uneven portion.

In a similar manner as in the previous embodiments, the upper base 210 may have a two-layer structure, including a first upper base 210a and a second upper base 210b. Accordingly, the upper dam 2301 may also include a first upper dam 2301a and a second upper dam 2301b, thereby making it possible to more effectively control the flow of the adhesive layer 400. The upper dam 2301 may have a height ranging from about 4 μm to about 5 μm.

In a similar manner as the previous embodiments, the lower dam 2302 may be formed in a two-layer structure, including a first lower dam 2302a and a second lower dam 2302b. At this time, the first lower dam 2302a may be formed simultaneously with the bank layer 124 using the same material, and the second lower dam 2302b may be formed simultaneously with the spacer 126, e.g., using the same material. As such, when the lower dam 2301 is formed in a two-layer structure, the lower dam 2302 may have a height of 3 μm or more.

With reference to the examples of FIGS. 7 and 8, in the touch organic light-emitting display device, as described above, the touch pad portion 2350 may be connected to the dummy pad electrode 2341 (see FIG. 4) of the dummy pad portion 2340 (see FIG. 4) by the seal 450 (see FIG. 4), e.g., having the conductive ball 455 (see FIG. 4), for example, an anisotropic conductive film (ACF). Meanwhile, the upper portions of the lighting pad electrodes 3351a and 3351b of the lighting pad portions 3350a and 3350b may be exposed to be connected to input pins for performing a test on lighting. Therefore, the lighting pad electrodes 3351a and 3351b may be more prone to contact failure due to overflow of the adhesive agent for forming the adhesive layer 400 than the touch pad portion 2350 and the dummy pad portion 2340.

In the third embodiment, the upper dam 2301 and the lower dam 2302, which may be provided between the lighting pad portion 3350 and the display area A/A, may prevent the adhesive agent for forming the adhesive layer 400 from overflowing to the lighting pad portions 3350a and 3350b. Further, as shown in FIG. 7, each of the upper dam 2301 and the lower dam 2302 may be formed in a stripe shape such that it may extend in the horizontal direction and may be bent diagonally toward the touch pad portion 2350. That is, each of the upper dam 2301 and the lower dam 2302 may be formed in a stripe shape that may include a portion arranged in the horizontal direction and a portion bent toward the touch pad portion.

Accordingly, the adhesive agent for forming the adhesive layer 400 may be induced to the region between the touch pad portion 2350 and the display area A/A, in which the routing lines 231a to 231c (see FIG. 8) may be formed. As a result, the region below the routing lines 231a to 231c may be filled with the adhesive layer 400, thereby firmly supporting the routing lines and reducing or preventing the occurrence of defects such as, for example, electric disconnection.

Figure 9:
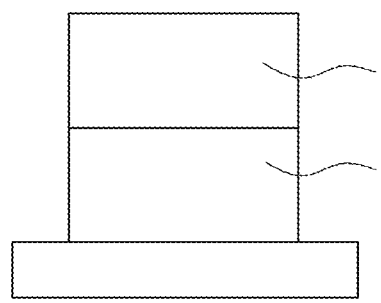
FIG. 9 is an illustrative view for explaining various shapes of the upper dam and the lower dam according to the present disclosure.
Figure 9:
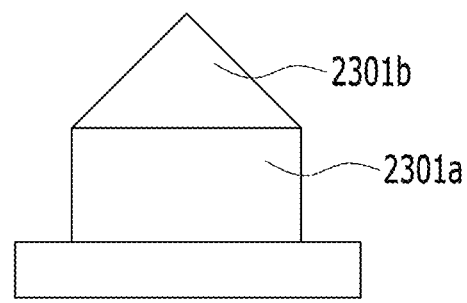
Figure 9:
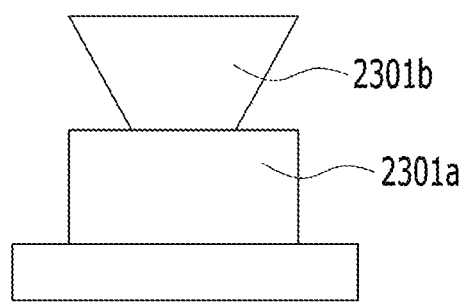
Figure 9:
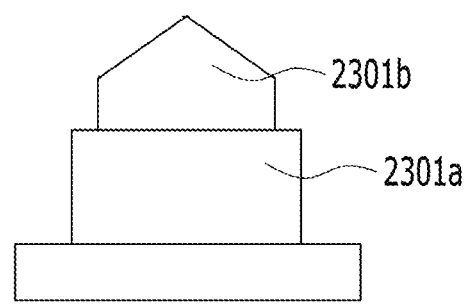
Figure 9:
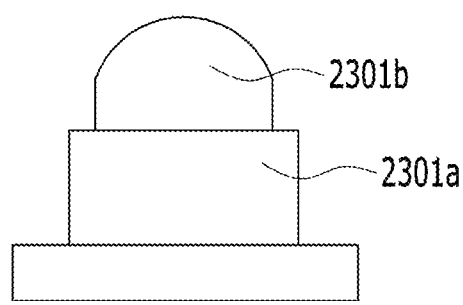

FIG. 9 is an illustrative view for explaining various shapes of the upper dam and the lower dam according to the present disclosure.

The upper dam 2301, as described above, may be formed in a two-layer structure, including the first upper dam 2301a and the second upper dam 2301b. The second upper dam 2301b may be formed to have a cross section having various shapes, for example, a triangular shape, a semicircular shape, a rectangular shape, or a polygonal shape. Embodiments are not limited to these examples. In the same way, the lower dam 2302 may have a two-layer structure, including the first lower dam 2302a and the second lower dam 2302b, and the second lower dam 2302b may also have various cross-sectional shapes, as shown in the FIG. 9 example.

For example, as shown in portion (c) of FIG. 9, when each of the second upper dam 2301b and the second lower dam 2302b is formed to have a cross section having a reverse taper shape, e.g., a reverse trapezoidal shape, space for receiving the adhesive layer that overflows the display area A/A may be increased. Therefore, the dam according to the present disclosure, which may have a reverse-taper-shaped cross section, may provide a better adhesive layer overflow prevention effect than that in the related art.

As is apparent from the above description, in a touch organic light-emitting display device according to the present disclosure, a concave pattern and an upper dam may be capable of reducing or preventing an adhesive agent for forming an adhesive layer from overflowing to electrodes of a pad portion by controlling the flow of the adhesive agent. In addition, because it may be permissible to apply a slightly large amount of adhesive agent owing to the concave pattern and the upper dam, the touch organic light-emitting display device according to the present disclosure has an effect of reducing or preventing the adhesive agent from being applied insufficiently due to concern about overflow, more reliably supporting routing lines by allowing the adhesive layer to be sufficiently applied to a region in which the routing lines are positioned, and reducing or preventing the routing lines from becoming defective, for example, becoming electrically disconnected.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A touch organic light-emitting display device, comprising:
   a substrate comprising:
      a display area; and
      a non-display area;
   a lower base crossing the display area and the non-display area;
   an upper base opposite the lower base, the upper base crossing the display area and the non-display area;
   a thin-film transistor array on the display area of the lower base;
   an organic light-emitting array on the thin-film transistor array, the organic light-emitting array comprising:
      a first electrode;
      a bank insulation film;
      a spacer;
      an emission layer; and
      a second electrode;
   an adhesive layer between the lower base and the upper base; and
   a pad portion in the non-display area, wherein the upper base comprises a plurality of concave patterns and at least one upper dam at a position corresponding to a region between the pad portion and the display area,
wherein the upper base further comprises a flexible material,
wherein the lower base comprises at least two lower dams, at least one of the at least two lower dams being at a position corresponding to a corresponding one of the at least one upper dam,
wherein the plurality of concave patterns and the at least one upper dam are formed by patterning the upper base, and
wherein the at least two lower dams comprises:
a first lower dam, and
a second lower dam.

2. The touch organic light-emitting display device of claim 1, wherein each of the concave patterns, the lower dam, and the at least one upper dam is formed in a stripe shape having a length greater than a length of the pad portion.

3. The touch organic light-emitting display device of claim 1, wherein the concave patterns comprise slits penetrating the upper base.

4. The touch organic light-emitting display device of claim 3, wherein the concave patterns have a width less than 200 μm.

5. The touch organic light-emitting display device of claim 3, further comprising a touch electrode array at a surface of the upper base opposite the organic light-emitting array, the touch electrode array being bonded to the organic light-emitting array via the adhesive layer.

6. The touch organic light-emitting display device of claim 5, further comprising:
a connecting portion configured to transmit a driving signal from an outside to the thin-film transistor array and the touch electrode array,
wherein each of the at least one upper dam, the at least two lower dams, and the concave patterns comprises a stripe shape bent toward the connecting portion.

7. The touch organic light-emitting display device of claim 1, wherein:
the first lower dam is formed simultaneously with the bank insulation film using a same material as the bank insulation film; and
the second lower dam is formed simultaneously with the spacer using a same material as the spacer.

8. The touch organic light-emitting display device of claim 5, wherein the pad portion comprises at least one of a touch pad portion for supplying a touch signal to the touch electrode array and a lighting pad portion for performing inspection of lighting by supplying an inspection signal to the thin-film transistor array.

9. The touch organic light-emitting display device of claim 8, further comprising:
a routing line at a position corresponding to a region between the touch pad portion and the display area,
wherein the routing line intersects the at least one upper dam and the concave patterns.

10. The touch organic light-emitting display device of claim 8, further comprising:
first and second lighting pad portions respectively positioned to a left and a right of the touch pad portion to be spaced apart therefrom,
wherein the at least one upper dam comprises a plurality of upper dams at a position corresponding to a region between the first lighting pad portion and the display area and a position corresponding to a region between the second lighting pad portion and the display area,
wherein the at least two lower dams comprises a plurality of lower dams at a position corresponding to a region between the first lighting pad portion and the display area and a position corresponding to a region between the second lighting pad portion and the display area, and
wherein each of the upper dams and the lower dams is formed in a stripe shape, the stripe shape comprising a portion arranged in a horizontal direction and a portion bent toward the touch pad portion.

11. The touch organic light-emitting display device of claim 10, further comprising:
a plurality of routing lines at a region between the touch pad portion and the display area in the upper base,
wherein the upper dams are positioned to a left and a right of the routing lines, and
wherein the lower dams are positioned to a left and a right of the routing lines.

12. The touch organic light-emitting display device of claim 1, wherein:
the upper base comprises:
a first upper base; and
a second upper base stacked on a surface of the first upper base opposite the lower base; and
the at least one upper dam comprises:
a first upper dam formed by the first upper base; and
a second upper dam formed by the second upper base.

13. The touch organic light-emitting display device of claim 11, wherein at least one of the second upper dam and the second lower dam has a cross-sectional shape comprising one of: a triangular shape, a rectangular shape, a semicircular shape, a polygonal shape, and a reverse taper shape.

14. An in-cell touch organic light-emitting display device, comprising:
a substrate comprising:
a display area; and
a non-display area;
an organic light-emitting element in the display area;
a touch electrode array over the organic light-emitting element;
a lower base crossing the display area and the non-display area;
an upper base opposite the lower base, the upper base crossing the display area and the non-display area;
a thin-film transistor array on the display area of the lower base;
an organic light-emitting array on the thin-film transistor array, the organic light-emitting array comprising:
a first electrode;
a bank insulation film;
a spacer;
an emission layer; and
a second electrode;
an adhesive layer between the lower base and the upper base; and
a pad portion in the non-display area,
wherein the upper base comprises a plurality of concave patterns and at least one upper dam at a position corresponding to a region between the pad portion and the display area,
wherein the lower base comprises at least two lower dams, at least one of the at least two lower dams being at a position corresponding to a corresponding one of the at least one upper dam,
wherein the upper base comprises a flexible material, wherein the plurality of concave patterns and the at least one upper dam are formed by patterning the upper base, and wherein the at least two lower dams comprises:
- a first lower dam, and
- a second lower dam.

\* \* \* \* \*